(12) United States Patent
Lin et al.

(10) Patent No.: US 10,420,204 B2
(45) Date of Patent: Sep. 17, 2019

(54) WIRING BOARD HAVING ELECTRICAL ISOLATOR AND MOISTURE INHIBITING CAP INCORPORATED THEREIN AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 887 days.

(21) Appl. No.: 14/846,987

(22) Filed: Sep. 7, 2015

(65) Prior Publication Data
US 2015/0382468 A1    Dec. 31, 2015

Related U.S. Application Data

(63) Continuation-in-part of application No. 14/621,332, filed on Feb. 12, 2015, now abandoned.
(Continued)

(51) Int. Cl.
H05K 1/02         (2006.01)
H01L 23/367       (2006.01)
(Continued)

(52) U.S. Cl.
CPC ....... H05K 1/0204 (2013.01); H01L 23/3677 (2013.01); H05K 1/02 (2013.01);
(Continued)

(58) Field of Classification Search
CPC .......... H05K 1/0204; H05K 3/00; H05K 1/02; H01L 23/3677
(Continued)

(56) References Cited

U.S. PATENT DOCUMENTS 7,670,872 B2    3/2010   Yan
8,003,415 B2 *  8/2011   Wang .................. H01L 23/3677
                                                    438/22
(Continued)

FOREIGN PATENT DOCUMENTS

TW         201422075 A      6/2014

OTHER PUBLICATIONS

Search report issued by the Taiwan Intellectual Property Office for the counterpart Taiwan Application No. 105118313.

*Primary Examiner* — Michael N Orlando
*Assistant Examiner* — Elizabeth Bradford
(74) *Attorney, Agent, or Firm* — Pai Patent & Trademark Law Firm; Chao-Chang David Pai

(57) ABSTRACT

A method of making a wiring board having an electrical isolator and metal posts incorporated in a resin core is characterized by the provision of moisture inhibiting caps covering interfaces between the electrical isolator/metal posts and a surrounding plastic material. In a preferred embodiment, the electrical isolator and metal posts are bonded to the resin core by an adhesive substantially coplanar with the metal films on the electrical isolator, the metal posts and the metal layers on two opposite sides of the resin core at smoothed lapped top and bottom surfaces so that a metal bridge can be deposited on the adhesive at the smoothed lapped bottom surface to completely cover interfaces between the electrical isolator/metal posts and the surrounding plastic material. Conductive traces are also deposited on the smoothed lapped top surface to provide electrical contacts for chip connection and electrically coupled to the metal posts.

2 Claims, 7 Drawing Sheets

Related U.S. Application Data

(60) Provisional application No. 61/949,652, filed on Mar. 7, 2014.

(51) Int. Cl.
    *H01L 33/64*       (2010.01)
    *H05K 3/20*        (2006.01)
    *H01L 23/498*     (2006.01)

(52) U.S. Cl.
    CPC ........ *H01L 23/49827* (2013.01); *H01L 33/64* (2013.01); *H01L 2224/16225* (2013.01); *H01L 2924/16152* (2013.01); *H05K 3/20* (2013.01); *H05K 2201/0187* (2013.01); *H05K 2201/10674* (2013.01); *H05K 2203/0191* (2013.01); *H05K 2203/063* (2013.01)

(58) Field of Classification Search
    USPC .......................................................... 156/150
    See application file for complete search history.

(56) References Cited

U.S. PATENT DOCUMENTS

| | | | |
|---|---|---|---|
| 8,247,369 B2* | 8/2012 | Chen | C12N 15/8286 514/1 |
| 8,895,998 B2 | 11/2014 | Hussell et al. | |
| 2006/0158804 A1* | 7/2006 | Usui | H01L 21/568 361/58 |
| 2013/0248234 A1* | 9/2013 | Inagaki | H01L 23/49816 174/260 |
| 2014/0048313 A1* | 2/2014 | Pan | H05K 1/0271 174/252 |
| 2014/0144677 A1 | 5/2014 | Wang et al. | |

\* cited by examiner

WIRING BOARD HAVING ELECTRICAL ISOLATOR AND MOISTURE INHIBITING CAP INCORPORATED THEREIN AND METHOD OF MAKING THE SAME

CROSS REFERENCE TO RELATED APPLICATIONS

This application is a continuation-in-part of U.S. application Ser. No. 14/621,332 filed Feb. 12, 2015, which claims benefit of U.S. Provisional Application Ser. No. 61/949,652 filed Mar. 7, 2014. Said applications are hereby incorporated by reference.

FIELD OF THE INVENTION

The present invention relates to a wiring board, and more particularly to a wiring board having an electrical isolator and metal posts incorporated in a resin core and a moisture inhibiting cap covering CTE mismatched interfaces and a method of making the same.

DESCRIPTION OF RELATED ART

High voltage or high current applications such as power module or light emitting diode (LED) often require high performance wiring board for signal interconnection. However, as the power increases, large amount of heat generated by semiconductor chip would degrade device performance and impose thermal stress on the chip. Ceramic material, such as alumina or aluminum nitride which is thermally conductive, electrically insulative and low CTE (Coefficient of Thermal Expansion), is often considered as a suitable material for such kind of applications. U.S. Pat. Nos. 8,895,998 and 7,670,872 disclose various interconnect structures using ceramic as chip attachment pad material for better reliability. In addition, for applications where signal routing is in vertical direction, electrically conductive material such as metal post is also needed in the resin board for transmitting electricity. However, when two materials with different CTEs are embedded in resin board and the contact areas of ceramic/resin and metal/resin are small, the interfaces between them are prone to crack or delamination during thermal cycling, making this type of circuit board prohibitively unreliable for practical usage, because large amount of moisture may leak through the cracked interfaces and damage the assembled chip.

SUMMARY OF THE INVENTION

A primary objective of the present invention is to provide a wiring board having moisture inhibiting caps covering interfaces between two CTE-mismatched materials so as to prevent passage of moisture through cracks at the interfaces caused by mismatched CTE, thereby improving the reliability of the semiconductor assembly.

Another objective of the present invention is to provide a wiring board having a low CTE electrical isolator embedded in a resin core so as to resolve the chip/board CTE mismatch problem, thereby improving the mechanical reliability of the semiconductor assembly.

Yet another objective of the present invention is to provide a wiring board in which routing circuitries on the electrical isolator extend to the resin core and are electrically coupled to metal posts, thereby allowing fine pitch assemblies such as flip chip to be assembled on the electrical isolator and interconnected to the external environment through the metal posts as vertical connections.

In accordance with the foregoing and other objectives, the present invention provides a wiring board having an electrical isolator, metal posts, a resin core, moisture inhibiting caps and conductive traces. The electrical isolator provides CTE-compensated contact interface for a semiconductor chip, and also provides primary heat conduction for the chip so that the heat generated by the chip can be conducted away. The resin core, which provides mechanical support for the electrical isolator, the metal posts, the moisture inhibiting caps and the conductive traces, serves as a spacer between the conductive traces and the moisture inhibiting caps. The moisture inhibiting caps, which laterally extend from the electrical isolator/metal posts to the resin core, seal interfaces between the electrical isolator/metal posts and a surrounding plastic material and serve as moisture barriers to prevent passage of moisture through cracks at the interfaces. The conductive traces, disposed on the top surfaces of the electrical isolator and the resin core, provide signal horizontal transmission and electrical routing of the board. The metal posts, laterally surrounded by the resin core, provide signal vertical transmission or ground/power plane for power delivery and return.

In another aspect, the present invention provides a method of making a wiring board, comprising the steps of: providing a metallized slug that includes an electrical isolator and first and second metal films respectively deposited on first and second sides of the electrical isolator, wherein the first and second metal films each have a planar outer surface in opposite first and second directions, respectively; providing metal posts each having planar first and second sides in the first and second directions, respectively; providing a stacking structure that includes first and second metal layers, a binding film disposed between the first and second metal layers, a first aperture, and second apertures extending through the first metal layer, the binding film and the second metal layer, wherein the first and second metal layers each have a planar outer surface in the first and second directions, respectively; inserting the metallized slug into the first aperture of the stacking structure and the metal posts into the second apertures of the stacking structure leaving gaps between the stacking structure and the metallized slug and between the stacking structure and the metal posts, and then curing the binding film to form a resin core that has a first side bonded to the first metal layer and an opposite second side bonded to the second metal layer, wherein the stacking structure is adhered to sidewalls of the metallized slug and the metal posts by an adhesive squeezed out from the binding film into the gaps between the stacking structure and the metallized slug and between the stacking structure and the metal posts; removing an excess portion of the squeezed out adhesive, thereby the adhesive having opposite exposed surfaces substantially coplanar with the outer surfaces of the first and second metal films and the first and second metal layers and the first and second sides of the metal posts in the first and second directions; forming conductive traces that includes contact pads and routing circuitries, wherein the contact pads laterally extend on the second side of the electrical isolator, and the routing circuitries electrically connect the contact pads and metal posts from the second direction; and forming moisture inhibiting caps that laterally extend from the first metal film of the metallized slug to the first metal layer on the resin core, and laterally extend from the first side of the metal posts to the first metal layer on the resin core to completely cover the exposed adhesive from the first direction.

In yet another aspect of the present invention, another method of making a wiring board comprises the steps of: attaching an electrical isolator and metal posts on a carrier film, wherein the electrical isolator has planar first and second sides in opposite first and second directions, respectively, and the metal posts each have planar first and second sides in the first and second directions, respectively; depositing a plastic embedding compound that covers the electrical isolator, the metal posts and the carrier film; removing a portion of the plastic embedding compound to form a resin core that is substantially coplanar with the electrical isolator and the metal posts in the second direction, and detaching the carrier film therefrom; forming conductive traces that includes contact pads and routing circuitries, wherein the contact pads laterally extend on the second side of the electrical isolator, and the routing circuitries electrically connect the contact pads and metal posts from the second direction; and forming moisture inhibiting caps that completely cover interfaces between the electrical isolator and the resin core and interfaces between the metal posts and the resin core from the first direction.

Unless specifically indicated or using the term "then" between steps, or steps necessarily occurring in a certain order, the sequence of the above-mentioned steps is not limited to that set forth above and may be changed or reordered according to desired design.

The method of making a wiring board according to the present invention has numerous advantages. For instance, depositing the moisture inhibiting caps to seal interfaces between the electrical isolator/metal posts and the surrounding plastic material can establish moisture barriers so that the moisture inhibiting caps can prevent moisture through cracks at the interfaces from ambiance into the interior of the semiconductor assembly, thereby improving the reliability of the assembly. Binding the resin core to the electrical isolator and the metal posts can provide a platform for high resolution circuitries disposed thereon, thereby allowing fine pitch assemblies such as flip chip and surface mount component to be assembled on the board.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-9 are schematic views showing a method of making a wiring board that includes an electrical isolator, metal posts, a resin core, moisture inhibiting caps and conductive traces in accordance with an embodiment of the present invention.

Figure 1:
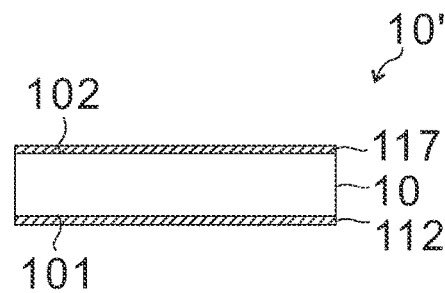
FIG. 1 is a cross-sectional view of a metallized slug in accordance with the first embodiment of the present invention.

FIG. 1 is a cross-sectional view of a metallized slug 10' having a first metal film 112 and a second metal film 117 respectively deposited on planar first and second sides 101, 102 of an electrical isolator 10. The electrical isolator 10 typically has high elastic modulus and low coefficient of thermal expansion (for example, $2 \times 10^{-6}$ $K^{-1}$ to $10 \times 10^{-6}$ $K^{-1}$), such as ceramic, silicon, glass or other thermally conductive and electrically insulating materials. In this embodiment, the electrical isolator 10 is a ceramic plate of 0.4 mm in thickness. The first metal film 112 and the second metal film 117 each have a planar outer surface and are typically made of copper and each have a thickness of 35 microns.

Figure 2:
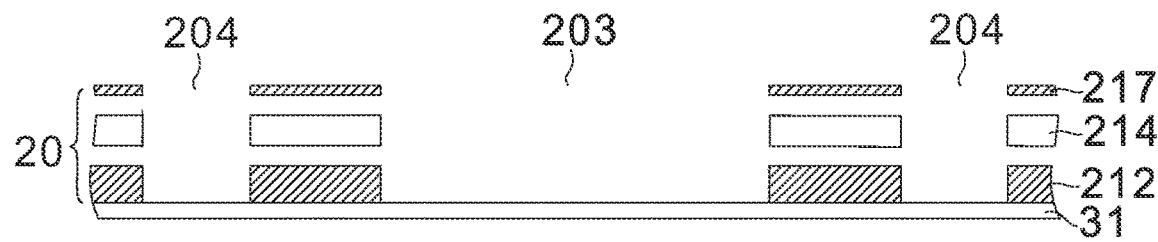
FIG. 2 is a cross-sectional view of a stacking structure on a carrier film in accordance with the first embodiment of the present invention.

FIG. 2 is a cross-sectional view of a stacking structure 20 having first and second apertures 203, 204 on a carrier film 31. The stacking structure 20 includes a first metal layer 212, a binding film 214 and a second metal layer 217. The first and second apertures 203, 204 are formed by punching through the first metal layer 212, the binding film 214 and the second metal layer 217. Also, the first and second apertures 203, 204 may be formed by other techniques such as laser cutting with or without wet etching. The carrier film 31 typically is a tape, and the first metal layer 212 is attached to the carrier film 31 by the adhesive property of the carrier film 31. In this stacking structure 20, the binding film 214 is disposed between the first metal layer 212 and the second metal layer 217. The first metal layer 212 and the second metal layer 217 are typically made of copper and each have two opposite planar surfaces facing towards the downward and upward directions, respectively. The binding film 214 can be various dielectric films or prepregs formed from numerous organic or inorganic electrical insulators. For instance, the binding film 214 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable. In this embodiment, the binding film 214 is a prepreg with B-stage uncured epoxy provided as a non-solidified sheet, and the first metal layer 212 and the second metal layer 217 are copper layers of 0.2 mm and 0.025 mm in thickness, respectively.

Figure 3:
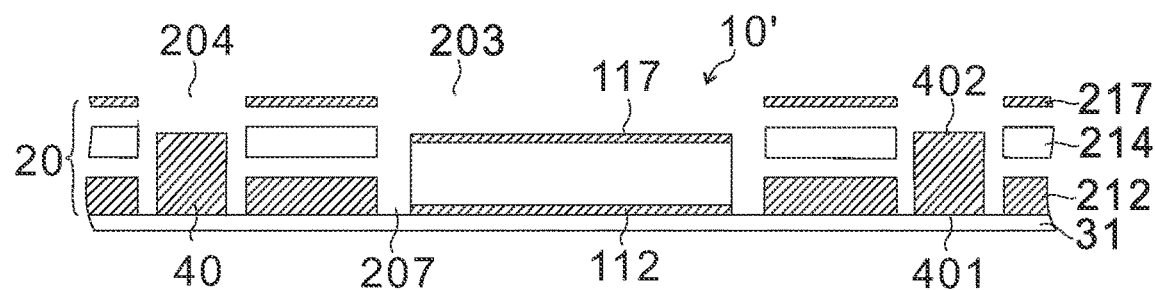
FIG. 3 is a cross-sectional view showing the metallized slug of FIG. 1 and metal posts are attached to the carrier film of FIG. 2 in accordance with the first embodiment of the present invention.

FIG. 3 is a cross-sectional view of the structure with the metallized slug 10' of FIG. 1 and metal posts 40 attached on the carrier film 31. The metallized slug 10' is inserted into the first aperture 203 of the stacking structure 20, whereas the metal posts 40 are inserted into the second apertures 204 of the stacking structure 20. The metal posts 40 each have opposite planar first and second sides 401, 402, and can be made of any electrically conductive material. In this embodiment, the metal posts 40 are copper posts each having a thickness substantially equal to that of the metallized slug 10'. The metallized slug 10' and the metal posts 40 are attached on the carrier film 31 with the outer surface of the first metal film 112 and the first side 401 of the metal posts 40 facing towards the carrier film 31 without contacting the stacking structure 20. As a result, gaps 207 are located in the first and second apertures 203, 204 between the metallized slug 10' and the stacking structure 20 and between the metal posts 40 and the stacking structure 20. The gaps 207 laterally surround the metallized slug 10' and the metal posts 40 and are laterally surrounded by the stacking structure 20. In this illustration, the metallized slug 10' and the metal posts 40 are attached to the carrier film 31 by the adhesive property of the carrier film 31. Also, the metallized slug 10' and the metal posts 40 may be attached to the carrier film 31 by dispensing extra adhesive.

Figure 4:
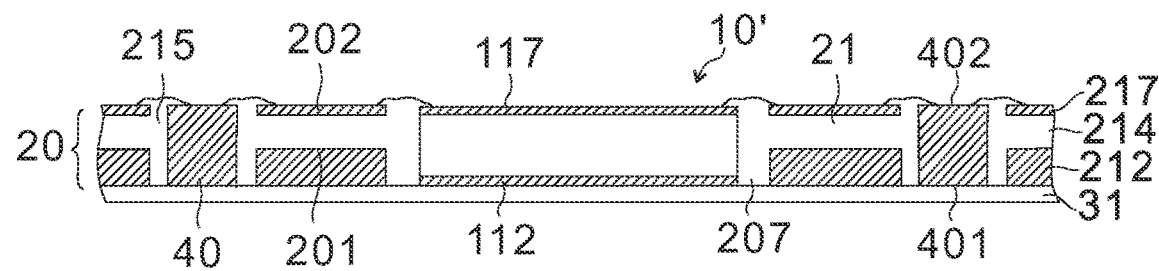
FIG. 4 is a cross-sectional view showing the stacking structure of FIG. 3 is subjected to a lamination process in accordance with the first embodiment of the present invention.

FIG. 4 is a cross-sectional view of the structure in which the gaps 207 are filled with an adhesive 215 squeezed out from the binding film 214. By applying heat and pressure, the binding film 214 is squeezed and part of the adhesive in the binding film 214 flows into the gaps 207. The bonding film 214 is compressed by applying downward pressure to the second metal layer 217 and/or upward pressure to the carrier film 31, thereby moving the first metal layer 212 and the second metal layer 217 towards one another and applying pressure to the binding film 214 while simultaneously applying heat to the binding film 214. The binding film 214 becomes compliant enough under the heat and pressure to conform to virtually any shape. As a result, the binding film 214 sandwiched between the first metal layer 212 and the second metal layer 217 is compressed, forced out of its original shape and flows into the gaps 207. The first metal layer 212 and the second metal layer 217 continue to move towards one another, and the binding film 214 remains sandwiched between and continues to fill the reduced space between the first metal layer 212 and the second metal layer 217. Meanwhile, the adhesive 215 squeezed out from the binding film 214 fills the gaps 207. In this illustration, the adhesive 215 squeezed out from the binding film 214 also rises slightly above the first and second apertures 203, 204 and overflows onto the top surfaces of the metallized slug 10', the metal posts 40 and the second metal layer 217. This may occur due to the binding film 214 being slightly thicker than necessary. As a result, the adhesive 215 squeezed out from the binding film 214 creates a thin coating on the top surfaces of the metallized slug 10', the metal posts 40 and the second metal layer 217. The motion eventually stops when the second metal layer 217 becomes coplanar with the second metal film 117 and the metal posts 40 at the top surface, but heat continues to be applied to the binding film 214 and the squeezed out adhesive 215, thereby converting the B-stage molten uncured epoxy into C-stage cured or hardened epoxy.

At this stage, the stacking structure 20 is bonded with sidewalls of the metallized slug 10' and the metal posts 40 by the adhesive 215 squeezed out from the binding film 214. The binding film 214 as solidified provides a secure robust mechanical bond between the first metal layer 212 and the second metal layer 217. Accordingly, the metallized slug 10' and the metal posts 40 are incorporated with a resin core 21 with the adhesive 215 sandwiched between the metallized slug 10' and the resin core 21 and between the metal posts 40 and the resin core 21. The resin core 21 has a first side

201 bonded to the first metal layer 212 and an opposite second side 202 bonded to the second metal layer 217.

Figure 5:
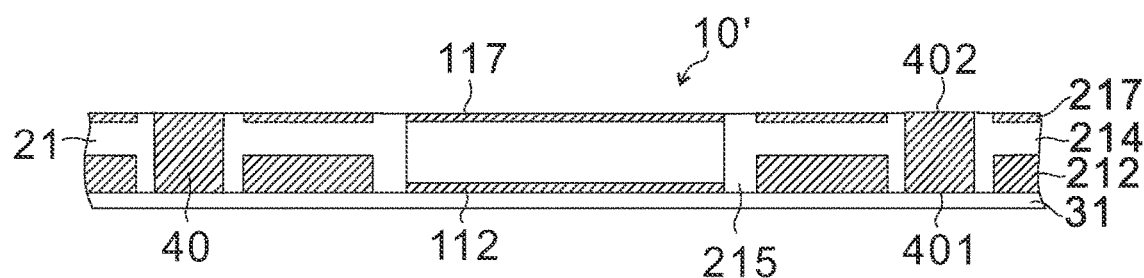
FIG. 5 is a cross-sectional view showing excess adhesive is removed from the structure of FIG. 4 in accordance with the first embodiment of the present invention.

FIG. 5 is a cross-sectional view of the structure after removal of excess adhesive that overflows onto the metallized slug 10', the metal posts 40 and the second metal layer 217. The excess adhesive can be removed by lapping/grinding. After lapping/grinding, the metallized slug 10', the metal posts 40, the second metal layer 217 and the adhesive 215 squeezed out from the binding film 214 are essentially coplanar with one another at a smoothed lapped/ground top surface.

Figure 6:
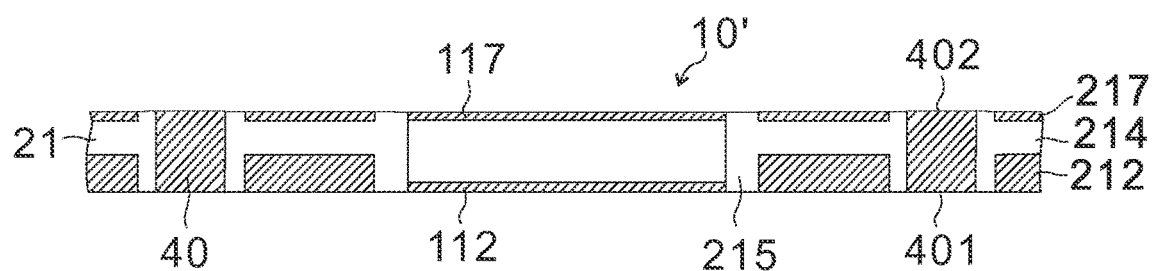
FIG. 6 is a cross-sectional view showing the carrier film is removed from the structure of FIG. 5 in accordance with the first embodiment of the present invention.

FIG. 6 is a cross-sectional view of the structure after removal of the carrier film 31. The carrier film 31 is detached from the metallized slug 10', the metal posts 40, the first metal layer 212 and the squeezed out adhesive 215 to expose the metallized slug 10', the metal posts 40 and the first metal layer 212 from below. Accordingly, the adhesive 215 has two opposite exposed surfaces essentially coplanar with the first and second sides 401, 402 of the metal posts 40, the outer surfaces of the first and second metal films 112, 117, and the outer surfaces of the first and second metal layers 212, 217 in the downward and upward directions, respectively.

Figure 7:
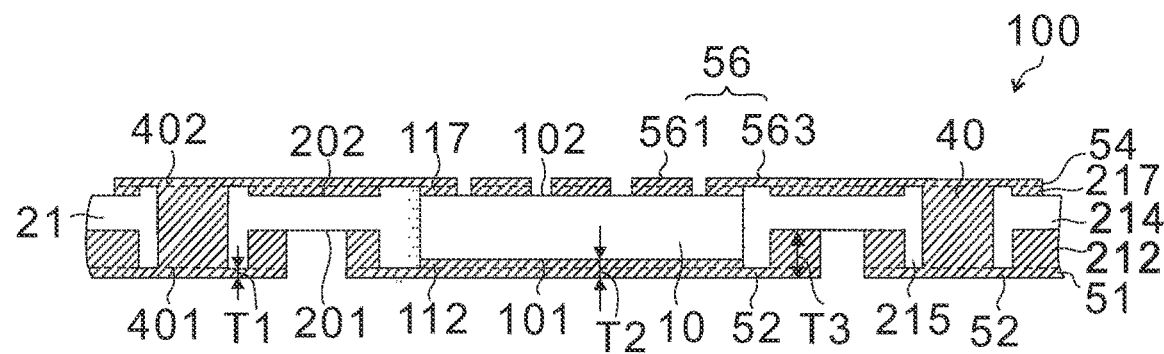
FIGS. 7, 8 and 9 are cross-sectional, bottom and top perspective views, respectively, showing the structure of FIG. 6 is provided with moisture inhibiting caps and conductive traces to finish the fabrication of a wiring board in accordance with the first embodiment of the present invention.
Figure 8:
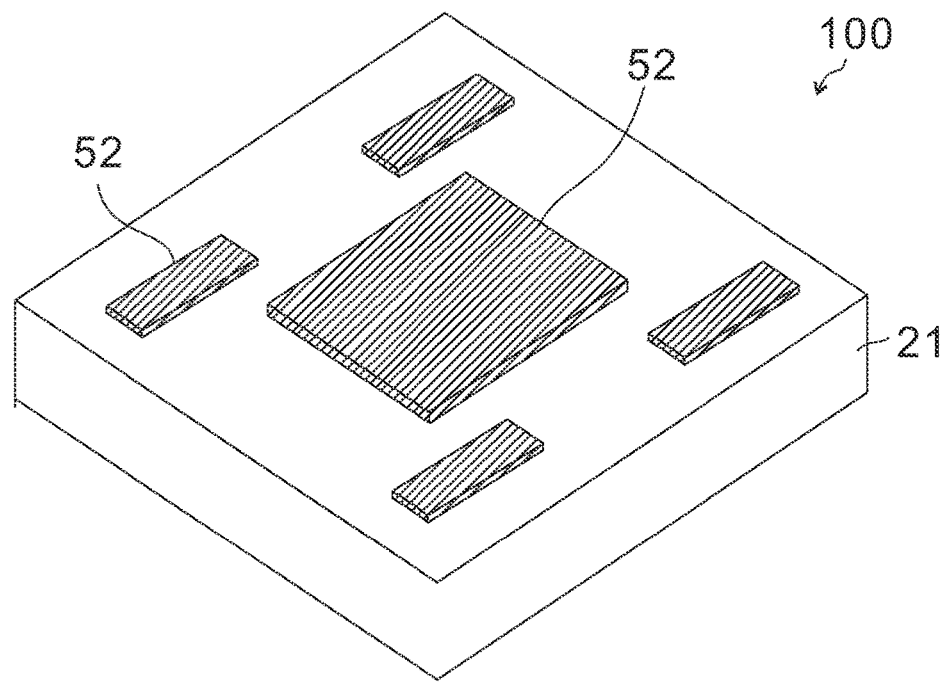
Figure 9:
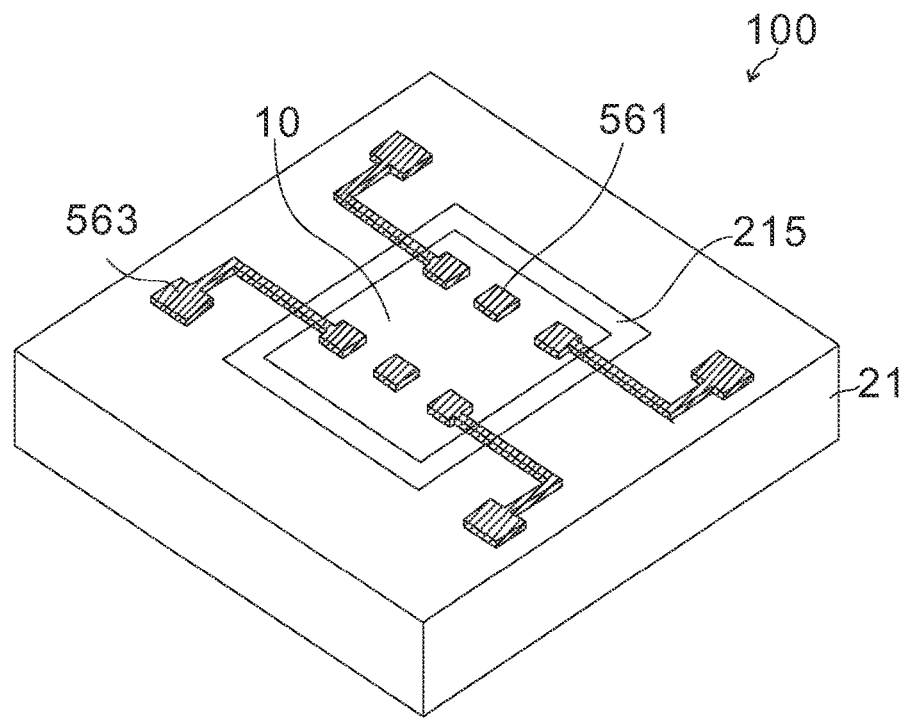

FIGS. 7, 8 and 9 are cross-sectional, bottom and top perspective views, respectively, of the structure provided with moisture inhibiting caps 52 and conductive traces 56. The bottom surface of the structure can be metallized to form a bottom plated layer 51 (typically a copper layer) as a single layer or multiple layers by numerous techniques, such as electroplating, electroless plating, evaporating, sputtering or their combinations. For instance, the structure can be first dipped in an activator solution to render the bottom surface of the structure catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper onto the bottom surface of the structure before depositing the electroplated copper layer on the seeding layer. After the deposition of the bottom plated layer 51, a metal patterning process is executed to form plural moisture inhibiting caps 52 spaced from each other. One of the moisture inhibiting caps 52, consisting of the first metal film 112, the first metal layer 212 and the bottom plated layer 51, includes a selected portion that laterally extends from the first metal film 112 on the electrical isolator 10 to the first metal layer 212 on the resin core 21, and the others of the moisture inhibiting caps 52, consisting of the first metal layer 212 and the bottom plated layer 51, each includes a selected portion that laterally extends from the first side 401 of the metal post 40 to the first metal layer 212 on the resin core 21. Specifically, the moisture inhibiting caps 52 have a first thickness T1 (about 0.5 to 50 microns) where it contacts the squeezed out adhesive 215, a second thickness T2 where it contacts the electrical isolator 10, a third thickness T3 where it contacts the resin core 21, and a flat surface that faces in the downward direction. In this illustration, the second thickness T2 and the third thickness T3 are larger than the first thickness T1, and the third thickness T3 is larger than the second thickness T2. The first metal film 112, the metal posts 40, the first metal layer 212 and the bottom plated layer 51 are shown as a single layer for convenience of illustration. The boundary (shown in dashed line) between the metal layers may be difficult or impossible to detect since copper is plated on copper. However, the boundary between the bottom plated layer 51 and the squeezed out adhesive 215 is clear.

Also, the top surface of the structure can be metallized to form a top plated layer 54 by the same activator solution, electroless copper seeding layer and electroplated copper layer. Once the desired thickness is achieved, a metal patterning process is executed to form the conductive traces 56 that include contact pads 561 and routing circuitries 563. The contact pads 561, consisting of the top plated layer 54 and the second metal film 117, laterally extend on the second side 102 of the electrical isolator 10, whereas the routing circuitries 563, consisting of the top plated layer 54, the second metal film 117 and the second metal layer 217, laterally extend on the second side 102 of the electrical isolator 10, the second side 202 of the resin core 21, the second side 402 of the metal posts 40 and the top surface of the adhesive 215 to contact and electrically connect the contact pads 561 and the metal posts 40. Also, the routing circuitries 563 completely cover the adhesive 215 between the metal posts 80 and the resin core 21 and interfaces between the metal posts 40 and the adhesive 215 from above. The contact pads 561 have a combined thickness of the second metal film 117 and the top plated layer 54 and can serve as electrical contacts for chip attachment. The routing circuitries 563 has a thickness of the top plated layer 54 (about 0.5 to 50 microns) where it contacts the squeezed out adhesive 215, a combined thickness of the second metal film 117 and the top plated layer 54 thereon where it contacts the electrical isolator 10, and a combined thickness of the second metal layer 217 and the top plated layer 54 thereon where it contacts the resin core 21. The routing circuitries 563 provide an electrical connection between the contact pads 561 and the metal posts 40. The metal patterning techniques include wet etching, electro-chemical etching, laser-assisted etching, and their combinations with etch masks (not shown) thereon that define the moisture inhibiting cap 52 and the conductive traces 56.

Accordingly, as shown in FIGS. 7, 8 and 9, a wiring board 100 is accomplished and includes an electrical isolator 10, metal posts 40, a resin core 21, a squeezed out adhesive 215, moisture inhibiting caps 52 and conductive traces 56. The resin core 21 covers and surrounds sidewalls of the electrical isolator 10 and the metal posts 40 and is mechanically connected to sidewalls of the electrical isolator 10 and the metal posts 40 by the squeezed out adhesive 215 between the electrical isolator 10 and the resin core 21 and between the metal posts 40 and the resin core 21. The moisture inhibiting caps 52 completely cover the adhesive 215 between the electrical isolator 10 and the resin core 21 and between the metal posts 40 and the resin core 21 as well as interfaces between the electrical isolator 10 and the adhesive 215 and between the metal posts 40 and the adhesive 215, and further laterally extend on the first side 201 of the resin core 21 from below. The conductive traces 56 laterally extend on the electrical isolator 10, the resin core 21, the metal posts 40 and the adhesive 215 from above to provide horizontal routing, and further are electrically coupled to the metal posts 40 that provide vertical routing. Also, the conductive traces 56 completely cover the adhesive 215 between the resin core 21 and the metal posts 40 and interfaces between the metal posts 40 and the adhesive 215 from above.

Figure 10:
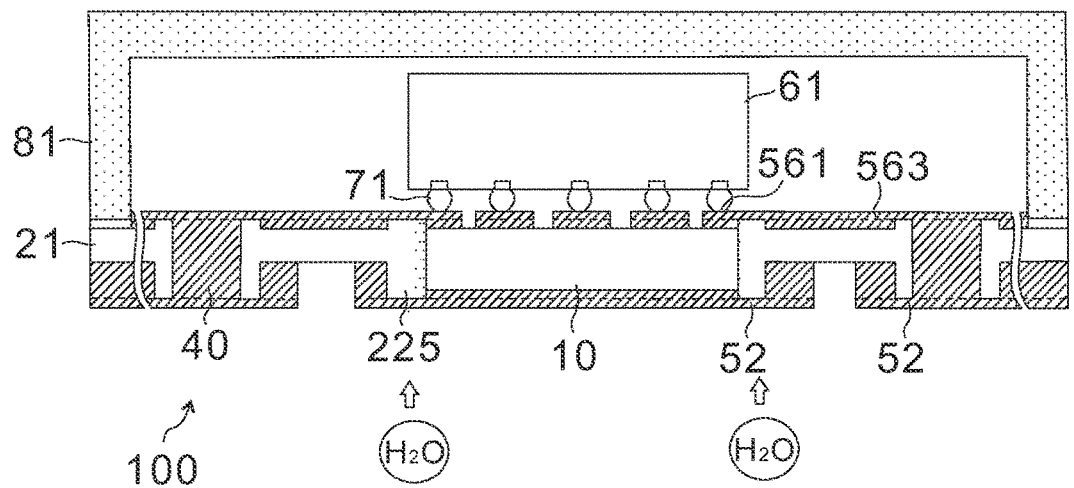
FIG. 10 is a cross-sectional view of a semiconductor assembly with a chip electrically connected to the wiring board of FIG. 9 in accordance with the first embodiment of the present invention.

FIG. 10 is a cross-sectional view of a semiconductor assembly 110 with a semiconductor device 61 electrically connected to the wiring board 100 illustrated in FIG. 7. The semiconductor device 61, illustrated as a chip, is flip-chip mounted on the contact pads 561 of the wiring board 100 via solder bumps 71. Further, a lid 81 is mounted on the wiring board 100 to enclose the semiconductor device 61 therein from above. Accordingly, even if cracks are caused by mismatched CTE between the electrical isolator 10 and the adhesive 215 and between the metal posts 40 and the adhesive 215, the moisture inhibiting caps 52 of the wiring board 100 can restrict the passage of moisture through the cracks from ambiance into the interior of the semiconductor assembly 110. Additionally, the electrical isolator 10 can provide CTE-buffered contact interface for the semiconductor device 61, and the heat generated by the semiconductor device 61 can be transferred to the electrical isolator 10 and further spread out to the moisture inhibiting cap 52 underneath the electrical isolator 10.

Embodiment 2

FIGS. 11-15 are schematic views showing another method of making a wiring board in which another stacking structure is provided to form a resin core in accordance with another embodiment of the present invention.

For purposes of brevity, any description in Embodiment 1 above is incorporated herein insofar as the same is applicable, and the same description need not be repeated.

Figure 11:
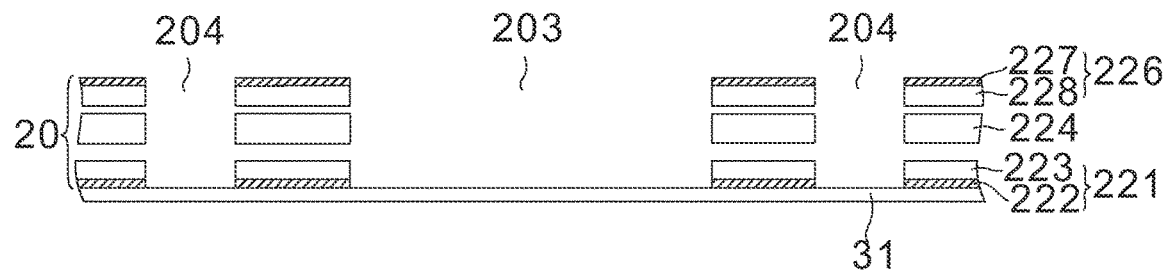
FIG. 11 is a cross-sectional view of a stacking structure on a carrier film in accordance with the second embodiment of the present invention.

FIG. 11 is a cross-sectional view of the structure with a stacking structure 20 on a carrier film 31. The stacking structure 20 includes a first laminate substrate 221, a binding film 224 and a second laminate substrate 226. The stacking structure 20 has first and second apertures 203, 204 that extend through the first laminate substrate 221, the binding film 224 and the second laminate substrate 226. In this illustration, the first laminate substrate 221 includes a first metal layer 222 disposed on a first dielectric layer 223, and the second laminate substrate 226 includes a second metal layer 227 disposed on a second dielectric layer 228. The first and second dielectric layers 223, 228 typically are made of epoxy resin, glass-epoxy, polyimide or the like, and have a thickness of 50 microns. The first and second metal layers 222, 227 typically are made of copper and have a thickness of 35 microns. In this stacking structure 20, the binding film 224 is disposed between the first laminate substrate 221 and the second laminate substrate 226, and the first metal layer 222 of the first laminate substrate 221 and the second metal layer 227 of the second laminate substrate 226 respectively face in the downward and upward directions. By the adhesive property of the carrier film 31, the stacking structure 20 is attached to the carrier film 31 with the first metal layer 222 of the first laminate substrate 221 in contact with the carrier film 31.

Figure 12:
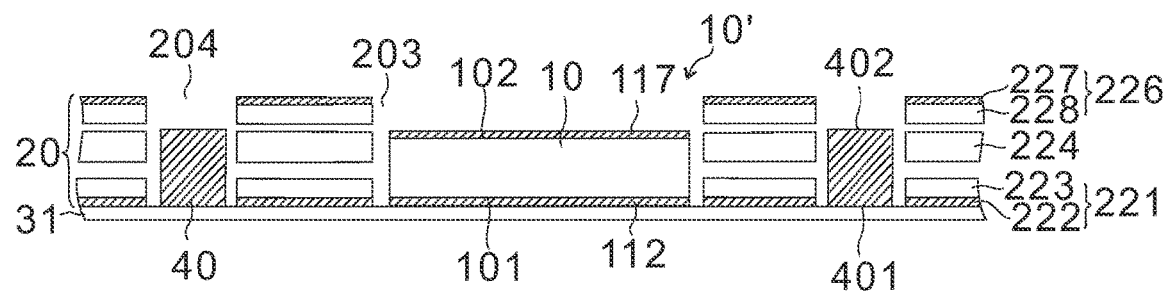
FIG. 12 is a cross-sectional view showing the metallized slug of FIG. 1 and metal posts are attached to the carrier film of FIG. 11 in accordance with the second embodiment of the present invention.

FIG. 12 is a cross-sectional view of the structure with the metallized slug 10' of FIG. 1 and metal posts 40 attached to the carrier film 31. The metallized slug 10' is inserted into the first aperture 203 of the stacking structure 20, whereas the metal posts 40 are inserted into the second apertures 204 of the stacking structure 20. The metallized slug 10' and the metal posts 40 are attached on the carrier film 31 with the outer surface of the first metal layer 112 and the first side 401 of the metal posts 40 facing towards the carrier film 31.

Figure 13:
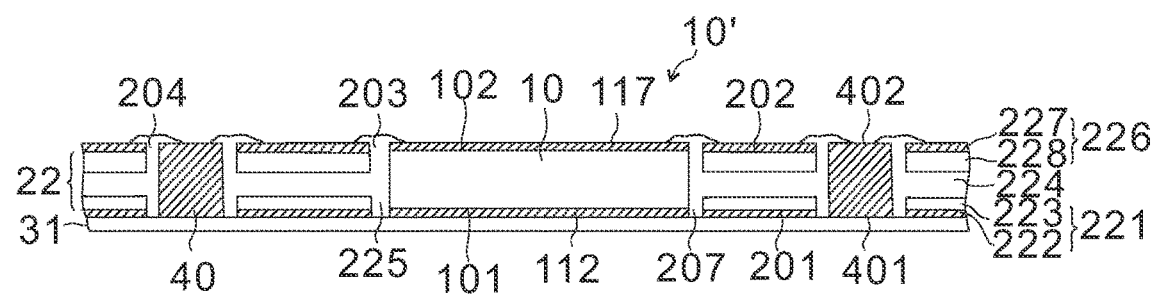
FIG. 13 is a cross-sectional view showing the stacking structure of FIG. 12 is subjected to a lamination process in accordance with the second embodiment of the present invention.

FIG. 13 is a cross-sectional view of the structure with an adhesive 225 squeezed out from the binding film 224 into gaps 207 between the metallized slug 10' and the stacking structure 20 and between the metal posts 40 and the stacking structure 20. By applying heat and pressure, the binding film 224 is squeezed and part of the adhesive in the binding film 224 flows into the gaps 207. After the squeezed out adhesive 225 fills up the gaps 207, the binding film 224 and the squeezed out adhesive 225 are solidified. Accordingly, the metallized slug 10' and the metal posts 40 are bonded to a resin core 22 by the squeezed out adhesive 225 in the gaps 207. In this illustration, the resin core 22 includes the first dielectric layer 223, the cured binding film 224 and the second dielectric layer 228, and has a first side 201 bonded to the first metal layer 222 and an opposite second side 202 bonded to the second metal layer 227. The cured binding film 224 is integrated with the first dielectric layer 223 of the first laminate substrate 221 and the second dielectric layer 228 of the second laminate substrate 226, and provides secure robust mechanical bonds between the first laminate substrate 221 and the second laminate substrate 226. The squeezed out adhesive 225 in the gaps 207 provides secure robust mechanical bonds between the metallized slug 10' and the resin core 22 and between the metal posts 40 and the resin core 22. The adhesive 225 squeezed out from the binding film 224 also rises slightly above the first and second apertures 203, 204 and overflows onto the top surfaces of the metallized slug 10', the second metal layer 227 and the metal posts 40.

Figure 14:
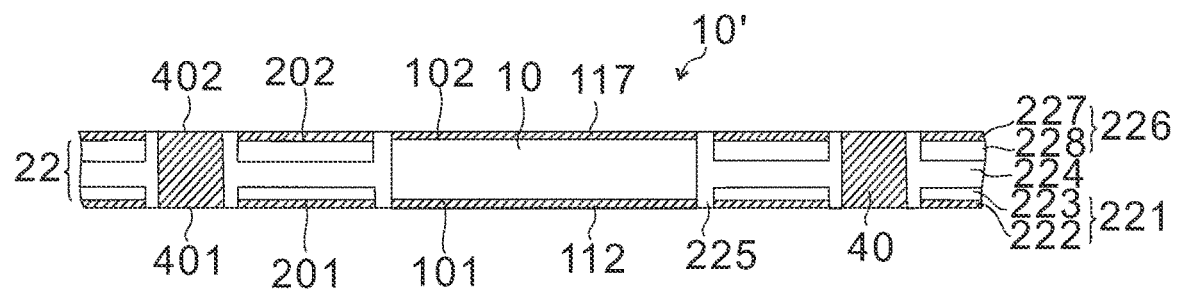
FIG. 14 is a cross-sectional view showing excess adhesive and the carrier film are removed from the structure of FIG. 13 in accordance with the second embodiment of the present invention.

FIG. 14 is a cross-sectional view of the structure after removal of excess adhesive and the carrier film 31. The excess adhesive on the second metal film 117, second metal layer 227 and the metal posts 40 is removed by lapping/grinding to create a smoothed lapped/ground top surface. The carrier film 31 is detached from the first metal film 112, the first metal layer 222, the metal posts 40 and the squeezed out adhesive 225 to expose the first metal film 112, the first metal layer 222 and the metal posts 40 from below. Accordingly, the adhesive 225 has two opposite exposed surfaces essentially coplanar with the outer surfaces of the first and second metal films 112, 117, the first and second sides 401, 402 of the metal posts 40, and the outer surfaces of the first and second metal layers 222, 227 in the downward and upward directions, respectively.

Figure 15:
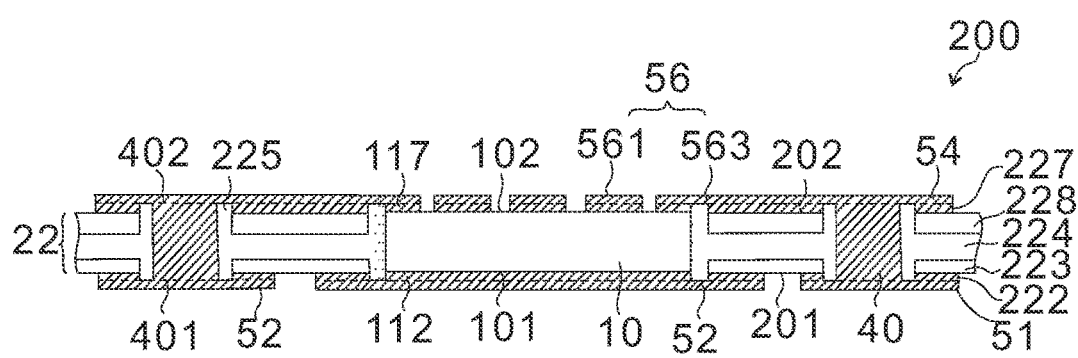
FIG. 15 is a cross-sectional view showing the structure of FIG. 14 is provided with moisture inhibiting caps and conductive traces to finish the fabrication of a wiring board in accordance with the second embodiment of the present invention.

FIG. 15 is a cross-sectional view of the structure provided with moisture inhibiting caps 52 and conductive traces 56. The moisture inhibiting caps 52 are formed by depositing a bottom plated layer 51, which is combined with the first metal film 112 and the first metal layer 222 from below, followed by a metal patterning process. Accordingly, the moisture inhibiting caps 52 include the first metal film 112, the first metal layer 222 and the bottom plated layer 51, and contacts and covers the electrical isolator 10, the resin core 22, the metal posts 40 and the squeezed out adhesive 225 from below. One of the moisture inhibiting caps 52 includes a selected portion that laterally extends from the first metal film 112 on the electrical isolator 10 to the first metal layer 222 on the resin core 22, and the others of the moisture inhibiting caps 52 each include a selected portion that laterally extends from the first side 401 of the metal post 40 to the first metal layer 222 on the resin core 22. Also, the top surface of the structure is metallized to form a top plated layer 54, followed by a metal patterning process to form the conductive traces 56. The conductive traces 56 contact and laterally extend on the second side 102 of the electrical isolator 10, the second side 202 of the resin core 22, the second side 402 of the metal posts 40, and the top surface of the adhesive 225 from above.

Accordingly, as shown in FIG. 15, a wiring board 200 is accomplished and includes an electrical isolator 10, metal posts 40, a resin core 22, a squeezed out adhesive 225, moisture inhibiting caps 52 and conductive traces 56. The resin core 22 is mechanically connected to the electrical isolator 10 and the metal posts 40 by the squeezed out adhesive 225. The moisture inhibiting caps 52 completely cover the adhesive 225 and interfaces between the electrical isolator 10 and the adhesive 225 and between the metal posts 40 and the adhesive 225, and further laterally extend on the resin core 22 from below. The conductive traces 56 include contact pads 561 on the second side 102 of the electrical isolator 10 and routing circuitries 563 electrically connecting the contact pads 561 and the metal posts 40 from above.

Embodiment 3

FIGS. 16-19 are schematic views showing yet another method of making a wiring board with a plastic embedding compound laterally covering sidewalls of an electrical isolator and metal posts in accordance with yet another embodiment of the present invention.

For purposes of brevity, any description in the aforementioned Embodiments is incorporated herein insofar as the same is applicable, and the same description need not be repeated.

Figure 16:
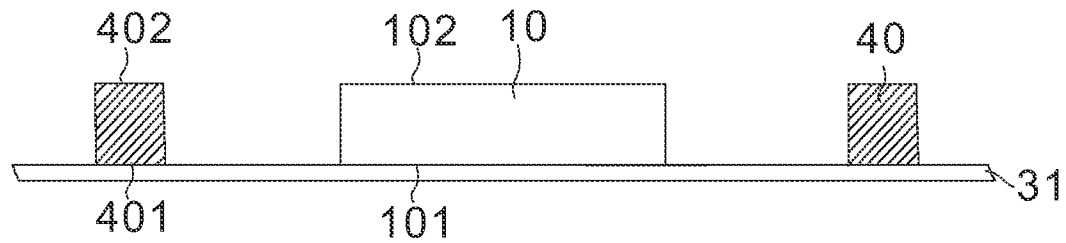
FIG. 16 is a cross-sectional view showing an electrical isolator and metal posts are attached to a carrier film in accordance with the third embodiment of the present invention.

FIG. 16 is a cross-sectional view of the structure with an electrical isolator 10 and metal posts 40 on a carrier film 31. The electrical isolator 10 and the metal posts 40 are attached on the carrier film 31 with their planar first sides 101, 401 in contact with the carrier film 31.

Figure 17:
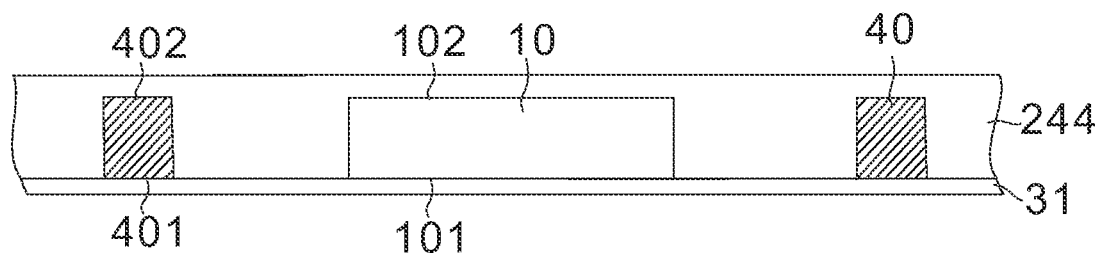
FIG. 17 is a cross-sectional view showing the structure of FIG. 16 is provided with a plastic embedding compound in accordance with the third embodiment of the present invention.

FIG. 17 is a cross-sectional view of the structure provided with a plastic embedding compound 244. The plastic embedding compound 244 can be deposited by a molding process or other methods such as lamination of epoxy or polyimide. The plastic embedding compound 244 covers the electrical isolator 10, the metal posts 40 and the carrier film 31 from above, laterally covers and surrounds and conformally coats the sidewalls of the electrical isolator 10 and the metal posts 40, and extends laterally from the electrical isolator 10 and the metal posts 40 to peripheral edges of the structure.

Figure 18:
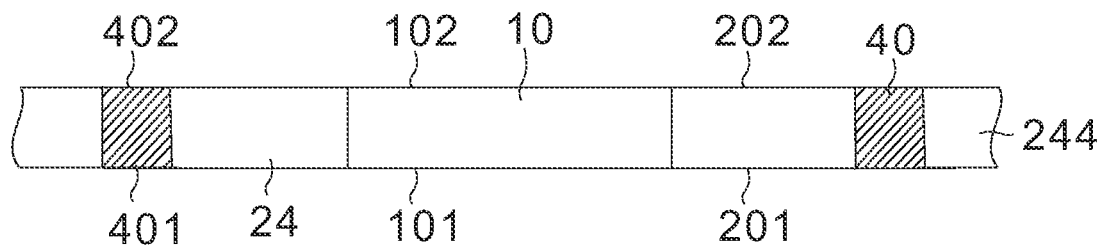
FIG. 18 is a cross-sectional view showing the upper portion of the plastic embedding compound and the carrier film are removed from the structure of FIG. 17 in accordance with the third embodiment of the present invention.

FIG. 18 is a cross-sectional view of the structure after removal of the carrier film 31 and the upper portion of the plastic embedding compound 244. The carrier film 31 is detached from the electrical isolator 10, the metal posts 40 and the plastic embedding compound 224. The upper portion of the plastic embedding compound 244 can be removed by lapping/grinding. After the lapping/grinding, the electrical isolator 10, the metal posts 40 and the plastic embedding compound 244 are essentially coplanar with each other at a smoothed lapped/ground top surface. Accordingly, the electrical isolator 10 is incorporated with a resin core 24 that has opposite first and second sides 201, 202 essentially coplanar with the planar first and second sides 101, 102 of the electrical isolator 10 and the planar first and second sides 401, 402 of the metal posts 40 in the downward and upward directions.

Figure 19:
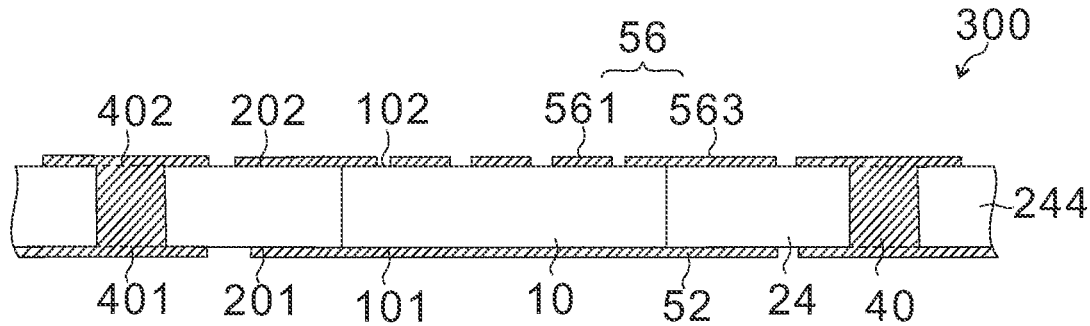
FIG. 19 is a cross-sectional view showing the structure of FIG. 18 is provided with moisture inhibiting caps and conductive traces to finish the fabrication of a wiring board in accordance with the third embodiment of the present invention.

FIG. 19 is a cross-sectional view of the structure provided with moisture inhibiting caps 52 and conductive traces 56. The moisture inhibiting caps 52 and conductive traces 56 can be deposited by a sputtering process and then an electrolytic plating process to achieve desired thickness. Once the desired thickness is achieved, a metal patterning process is executed to form the moisture inhibiting caps 52 and the conductive traces 56. The moisture inhibiting caps 52 are patterned metal layers of 0.5 to 50 microns in thickness and completely cover interfaces between the electrical isolator 10 and the plastic embedding compound 244 and between the metal posts 40 and the plastic embedding compound 244 from below. The conductive traces 56 laterally extend on the second side 102 of the electrical isolator 10, the second side 202 of the resin core 24 and the second side 402 of the metal posts 40 and have a thickness of 0.5 to 50 microns.

Accordingly, as shown in FIG. 19, a wiring board 300 is accomplished and includes an electrical isolator 10, metal posts 40, a resin core 24, moisture inhibiting caps 52 and conductive traces 56. The resin core 24 covers and surrounds sidewalls of the electrical isolator 10 and the metal posts 40 and is bonded to the electrical isolator 10 and the metal posts 40. One of the moisture inhibiting caps 52 laterally extends below the electrical isolator 10 and beyond peripheral edges of the electrical isolator 10, whereas the others of the moisture inhibiting caps 52 laterally extend below the metal posts 40 and beyond peripheral edges of the metal posts 40. The conductive traces 56 include contact pads 561 on the second side 102 of the electrical isolator 10 and routing circuitries 563 that contact and electrically connect the contact pads 561 and the metal posts 40 and completely cover interfaces between the metal posts 40 and the plastic embedding compound 244 from above.

As illustrated in the aforementioned embodiments, a distinctive wiring board is configured to have an electrical isolator, metal posts and moisture inhibiting caps and exhibit improved reliability. Preferably, the wiring board includes an electrical isolator, metal posts, a resin core, moisture inhibiting caps, contact pads and routing circuitries, wherein (i) the electrical isolator has planar first and second sides in opposite first and second directions, respectively; (ii) the metal posts have planar first and second sides in the first and second directions, respectively; (iii) the resin core covers and surrounds sidewalls of the electrical isolator and the metal posts; (iv) the moisture inhibiting caps laterally extend from the electrical isolator/metal posts to the resin core, and completely cover interfaces between the electrical isolator/metal posts and a surrounding plastic material from the first direction; (v) the contact pads laterally extend on the second side of the electrical isolator; (vi) the routing circuitries electrically connect the contact pads and the metal posts from the second direction.

The electrical isolator can provide a platform for chip attachment, whereas the metal posts can serve as signal vertical transduction pathway or provide ground/power plane for power delivery and return. Specifically, the electrical isolator is made of a thermally conductive and electrically insulating material and typically has high elastic modulus and low coefficient of thermal expansion (for example, $2 \times 10^{-6}$ $K^{-1}$ to $10 \times 10^{-6}$ $K^{-1}$). As a result, the electrical isolator provides a CTE-compensated contact interface for a semiconductor chip, and thus internal stresses caused by CTE mismatch can be largely compensated or reduced. Further, the electrical isolator also provides primary heat conduction for the chip so that the heat generated by the chip can be conducted away.

The resin core can be bonded to the electrical isolator and the metal posts by a lamination process. For instance, a metallized slug can be provided by depositing first and second metal films (typically copper films) respectively on opposite first and second sides of the electrical isolator, followed by inserting the metallized slug and the metal posts respectively into first and second apertures of a stacking structure having a binding film disposed between a first metal layer and a second metal layer, and then applying heat and pressure in a lamination process to cure the binding film. By the lamination process, the binding film can provide a secure robust mechanical bond between the first metal layer and the second metal layer, and an adhesive squeezed out from the binding film covers and surrounds and conformally coats sidewalls of the metallized slug and the metal posts. As a result, a resin core is formed to have opposite first and second sides respectively bonded to the first and second metal layers (typically copper layers), and is adhered to the sidewalls of the metallized slug and the metal posts by the squeezed out adhesive between the metallized slug and the resin core and between the metal posts and the resin core.

Preferably, the adhesive has a first surface substantially coplanar with the outer surface of the first metal film on the electrical isolator, the outer surface of the first metal layer on the resin core, and the first side of the metal posts in the first direction, and an opposite second surface substantially coplanar with the outer surface of the second metal film on the electrical isolator, the outer surface of the second metal layer on the resin core, and the second sides of the metal posts in the second direction. As another aspect of the present invention, the resin core may be formed by a molding process or other methods such as lamination of epoxy or polyimide to deposit a plastic embedding compound that surrounds and conformally coats and contacts sidewalls of the electrical isolator and the metal posts. As a result, the resin core can have opposite first and second sides substantially coplanar with the first sides of the electrical isolator and the metal posts and the second sides of the electrical isolator and the metal posts, respectively.

Before the aforementioned lamination or molding process, a carrier film (typically an adhesive tape) may be used to provide temporary retention force. For instance, the carrier film can temporally adhere to the first or second metal film of the metallized slug, the first or second side of the metal posts, and the first or second metal layer of the stacking structure to retain the metallized slug and the metal posts within the first and second apertures of the stacking structure, respectively, followed by the lamination process of the stacking structure. As for the molding case, the carrier film can adhere to the first or second side of the electrical isolator and the first or second side of the metal posts, followed by depositing the plastic embedding compound that covers the carrier film and the sidewalls of the electrical isolator and the metal posts. After the electrical isolator and the metal posts are bonded with the resin core as mentioned above, the carrier film is detached therefrom before depositing the moisture inhibiting caps/the conductive traces.

The moisture inhibiting caps can be metal layers (typically copper layers) that completely cover interfaces between two mismatched CTE materials in the first direction. In accordance with the aspect of the resin core bonded to the electrical isolator and the metal posts by the lamination of the stacking structure, the moisture inhibiting caps can contact and completely cover the adhesive between the electrical isolator and the resin core and between the metal posts and the resin core as well as interfaces between the electrical isolator and the adhesive and between the metal posts and the adhesive in the first direction, and further laterally extend on the first side of the resin core. In this aspect, the moisture inhibiting caps can be deposited by electroless plating followed by electrolytic plating. After deposition of a plated layer on the first surface of the adhesive, the outer surfaces of the first metal film on the electrical isolator, the outer surface of the first metal layer on the resin core, and the first side of the metal posts, a patterning process can be executed to form the moisture inhibiting caps spaced from each other. In a preferred embodiment, one of the moisture inhibiting caps includes a selected portion that laterally extends from the first metal film on the electrical isolator to the first metal layer on the resin core, whereas the others include selected portions that laterally extend from the first side of the metal posts to the first metal layer on the resin core. More specifically, the moisture inhibiting caps include the first metal film on the electrical isolator and the first metal layer of the stacking structure, and have a first thickness (equal to the thickness of the plated layer in about 0.5 to 50 microns) where it contacts the adhesive, a second thickness (equal to the combined thickness of the plated layer and the first metal film) where it contacts the electrical isolator, a third thickness (equal to the combined thickness of the plated layer and the first metal layer) where it contacts the resin core, and a flat surface that faces in the first direction. The second thickness and the third thickness are larger than the first thickness, and the second thickness may be equal to or different from the third thickness. In accordance with another aspect of the resin core bonded to the electrical isolator and the metal posts by depositing the plastic embedding compound, the moisture inhibiting caps can be deposited by thin film sputtering followed by electrolytic plating. After deposition of a plated layer on the first sides of the electrical isolator, the metal posts and the plastic embedding compound, a patterning process can be executed to form the moisture inhibiting caps below the electrical isolator and the metal posts. In another preferred embodiment, the moisture inhibiting caps laterally extend on the first sides of the electrical isolator, the resin core and the metal posts, and completely cover interfaces between the electrical isolator and the plastic embedding compound and the metal posts and the plastic embedding compound in the first direction, and have a thickness of about 0.5 to 50 microns.

The conductive traces include contact pads on the second side of the electrical isolator and routing circuitries that electrically connect the contact pads and the metal posts from the second direction. More specifically, the routing circuitries laterally extend from the second side of the metal posts to the second side of the electrical isolator. As a result, the routing circuitries can contact and provide signal transmission between the metal posts and the contact pads, and also completely cover CTE mismatched interfaces around the metal posts in the second direction. The contact pads can provide electrical contacts for semiconductor device connection, whereas the routing circuitries can provide horizontal routing and be electrically coupled to the metal posts that can serve as vertical electrical connections. The conductive traces can be formed by metal deposition and then metal patterning. For the aspect of the resin core bonded to the electrical isolator and the metal posts by the lamination of the stacking structure, the conductive traces typically are deposited by an electroless plating process and then an electrolytic plating process. Specifically, a plated layer can be deposited on and cover the second metal film on the electrical isolator, the second surface of the adhesive, the second metal layer on the resin core and the second side of the metal posts in the second direction, followed by a patterning process to form the contact pads on the second side of the electrical isolator and the routing circuitries that completely cover the adhesive between the metal posts and the resin core as well as interfaces between the metal posts and the adhesive in the second direction and laterally extend to the contact pads and the metal posts. As a result, the contact pads have a combined thickness of the second metal film and the plated layer, and the routing circuitries have a thickness of the plated layer where it contacts the adhesive, a combined thickness of the second metal film and the plated layer where it contacts the electrical isolator, and a combined thickness of the second metal layer and the plated layer where it contacts the resin core. As for the aspect of the resin core bonded to the electrical isolator and the metal posts by depositing the plastic embedding compound, the conductive traces typically are deposited by a sputtering process and then an electrolytic plating process. After the deposition process, a patterning process is executed to form the contact pads on the second side of the electrical isolator and the routing circuitries that completely cover interfaces between the metal posts and the plastic embedding compound in the second direction and laterally extend to the contact pads and the metal posts. In this case, the contact pads and the routing circuitries typically have the same thickness.

The present invention also provides a semiconductor assembly in which a semiconductor device such as chip is mounted on the contact pads of the aforementioned wiring board. Specifically, the semiconductor device can be electrically connected to the wiring board using various using a wide variety of connection media including gold or solder bumps on the contact pads of the wiring board. Further, a lid can be provided to enclose the semiconductor device therein. Accordingly, even if cracks are generated at the interfaces between two mismatched CTE materials, the moisture inhibiting caps of the wiring board can restrict the passage of moisture through the cracks from ambiance into the interior of the semiconductor assembly. Further, the electrical isolator incorporated in the wiring board can provide CTE-compensated contact interface for the semiconductor device, and the heat generated by the semiconductor device can be transferred to the electrical isolator and further spread out to the moisture inhibiting cap that is located underneath the electrical isolator and laterally extends beyond peripheral edges of the electrical isolator and has a larger thermal dissipation surface area than the electrical isolator.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The chip can be a packaged or unpackaged chip. Furthermore, the chip can be a bare chip, or a wafer level packaged die, etc.

The term "cover" refers to incomplete or complete coverage in a vertical and/or lateral direction. For instance, in the position that the moisture inhibiting caps face the downward direction, the semiconductor device covers the electrical isolator in the upward direction regardless of whether another element such as the contact pad is between the semiconductor device and the electrical isolator.

The phrases "mounted on" and "attached on" include contact and non-contact with a single or multiple support element(s). For instance, the metallized slug and the metal posts can be attached on the carrier film regardless of whether they contact the carrier film or are separated from the carrier film by an adhesive.

The phrases "electrical connection", "electrically connected" and "electrically coupled" refer to direct and indirect electrical connection. For instance, the semiconductor device is electrically connected to the contact pads by the bumps but does not contact the contact pads The "first direction" and "second direction" do not depend on the orientation of the wiring board, as will be readily apparent to those skilled in the art. For instance, the first side of the electrical isolator faces the first direction and the second side of the electrical isolator faces the second direction regardless of whether the wiring board is inverted. Thus, the first and second directions are opposite one another and orthogonal to the lateral directions, and a lateral plane orthogonal to the first and second directions intersects laterally aligned elements. Furthermore, the first direction is the downward direction and the second direction is the upward direction in the position that the moisture inhibiting caps face the downward direction, and the first direction is the upward direction and the second direction is the downward direction in the position that the moisture inhibiting caps face the upward direction.

The wiring board according to the present invention has numerous advantages. The electrical isolator provides CTE-compensated contact interface for chip attachment and also establish a heat dissipation pathway from the chip to the moisture inhibiting cap underneath the electrical isolator. The resin core provides mechanical support and serves as a spacer between the conductive traces and the moisture inhibiting caps and between the electrical isolator and the metal posts. The moisture inhibiting caps seal interfaces between the electrical isolator/metal posts and a surrounding plastic material and restricts the passage of moisture though cracks at the interfaces. The conductive traces provide horizontal electrical routing of the board, whereas the metal posts provide vertical electrical routing of the board. The wiring board made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a wiring board having electrical isolator and moisture inhibiting cap incorporated therein, comprising steps of:

attaching an electrical isolator and metal posts on a carrier film, wherein the electrical isolator has planar first and second sides in opposite first and second directions, respectively, and the metal posts each have planar first and second sides in the first and second directions, respectively;

depositing a plastic embedding compound that covers the electrical isolator, the metal posts and the carrier film and also completely surrounds and contacts sidewalls of the metal posts and sidewalls of the electrical isolator;

removing a portion of the plastic embedding compound to form a resin core that completely surrounds the sidewalls of the metal posts and the sidewalls of the electrical isolator and is substantially coplanar with the electrical isolator and the metal posts in the second direction, and detaching the carrier film therefrom;

forming conductive traces that includes contact pads and routing circuitries, wherein the contact pads laterally extend on the second side of the electrical isolator for connecting a semiconductor device, and the routing circuitries electrically connect the contact pads and metal posts from the second direction to provide signal transmission between the contact pads and the metal posts; and forming moisture inhibiting caps that completely cover interfaces between the electrical isolator and the resin core and interfaces between the metal posts and the resin core from the first direction.

2. The method of claim 1, wherein the moisture inhibiting caps are metal layers formed by thin film sputtering followed by electrolytic plating and each has a thickness between 0.5 and 50 microns.

\* \* \* \* \*